US00RE49210E

(19) United States
(12) Reissued Patent
Olochwoszcz et al.

(10) Patent Number: US RE49,210 E
(45) Date of Reissued Patent: Sep. 13, 2022

(54) METHOD AND APPARATUS FOR LEVEL CONTROL IN BLENDING AN AUDIO SIGNAL IN AN IN-BAND ON-CHANNEL RADIO SYSTEM

(71) Applicant: Ibiquity Digital Corporation, Columbia, MD (US)

(72) Inventors: Gabriel Olochwoszcz, Hillsborough, NJ (US); Ashwini Pahuja, Roslyn Heights, NY (US); Scott Vincelette, Sparta, NJ (US)

(73) Assignee: Ibiquity Digital Corporation, Columbia, MD (US)

(21) Appl. No.: 16/556,658

(22) Filed: Aug. 30, 2019

Related U.S. Patent Documents

Reissue of:
(64) Patent No.: 9,755,598
Issued: Sep. 5, 2017
Appl. No.: 14/974,809
Filed: Dec. 18, 2015

(51) Int. Cl.
*H04H 20/47* (2008.01)
*H03G 3/30* (2006.01)
(Continued)

(52) U.S. Cl.
CPC ..... *H03G 3/3005* (2013.01); *G10L 19/167* (2013.01); *H03G 3/002* (2013.01);
(Continued)

(58) Field of Classification Search
CPC ..... H04H 20/22; H04H 20/26; H04H 20/47; H04H 40/36; H04H 2201/18; H03G 3/002; H03G 3/3005; G10L 19/167
See application file for complete search history.

(56) References Cited

U.S. PATENT DOCUMENTS 4,747,143 A * 5/1988 Kroeger ..... G10L 21/0208 330/136
6,178,317 B1 1/2001 Kroeger et al.
(Continued)

FOREIGN PATENT DOCUMENTS

EP 3391562 B1 5/2021
WO 2017106612 A1 6/2017
(Continued)

OTHER PUBLICATIONS

"Algorithms to measure audio programme loudness and true-peak audio level", Recommendation ITU-R BS.1770-3, (2012), 1-22.
(Continued)

*Primary Examiner* — Ovidio Escalante
(74) *Attorney, Agent, or Firm* — Schwegman Lundberg & Woessner, P.A.

(57) ABSTRACT

A method for processing a digital audio broadcast signal includes: separating an analog audio portion and a digital audio portion of the digital audio broadcast signal; determining the loudness of the analog audio portion and the digital audio portion over a first short time interval; using the loudness of the analog and digital audio portions to calculate a short term average gain; determining a long term average gain; converting one of the long term average gain or the short term average gain to dB; if an output has been blended to digital, adjusting a digital gain parameter by a preselected increment to produce a digital gain parameter; if an output has not been blended to digital, setting the digital gain parameter to the short term average gain; providing the
(Continued)

digital gain parameter to an audio processor; and repeating the above steps using a second short time interval.

20 Claims, 5 Drawing Sheets

(51) Int. Cl.

| | |
|---|---|
| ***H04H 40/36*** | (2008.01) |
| ***H03G 3/00*** | (2006.01) |
| ***G10L 19/16*** | (2013.01) |
| ***H04H 20/22*** | (2008.01) |
| ***H04H 20/26*** | (2008.01) |

(52) U.S. Cl.
CPC ..... *H04H 20/22* (2013.01); *H04H 20/26* (2013.01); *H04H 20/47* (2013.01); *H04H 40/36* (2013.01); *H04H 2201/18* (2013.01)

(56) References Cited

U.S. PATENT DOCUMENTS

| | | | | |
|---|---|---|---|---|
| 6,473,604 | B1 | 10/2002 | Hinkle et al. | |
| 6,590,944 | B1 | 7/2003 | Kroeger | |
| 6,735,257 | B2 | 5/2004 | Kroeger | |
| 6,901,242 | B2 | 5/2005 | Kroeger et al. | |
| 7,039,204 | B2 | 5/2006 | Baumgarte | |
| 7,546,088 | B2 | 6/2009 | Kroeger et al. | |
| 7,715,566 | B2 | 5/2010 | Seo | |
| 7,944,998 | B2 | 5/2011 | Shridhar et al. | |
| 7,953,183 | B2 | 5/2011 | Shridhar et al. | |
| 8,014,446 | B2 | 9/2011 | Shah et al. | |
| 8,027,419 | B2 | 9/2011 | Iannuzzelli et al. | |
| 8,040,989 | B2 | 10/2011 | Nekhamkin et al. | |
| 8,165,548 | B2 | 4/2012 | Kon et al. | |
| 8,180,470 | B2 | 5/2012 | Pahuja | |
| 8,290,423 | B2 | 10/2012 | Wang et al. | |
| 8,520,852 | B2 | 8/2013 | Shah et al. | |
| 8,576,949 | B2 | 11/2013 | Shah et al. | |
| 8,615,095 | B2 | 12/2013 | Chen | |
| 8,804,865 | B2 | 8/2014 | Elenes et al. | |
| 8,976,969 | B2 | 3/2015 | Elenes et al. | |
| 9,025,773 | B2 | 5/2015 | Whitecar et al. | |
| 9,300,413 | B2 | 3/2016 | Jaisimha et al. | |
| 9,407,383 | B2 | 8/2016 | Milbar et al. | |
| 9,413,322 | B2 | 8/2016 | Soulodre et al. | |
| 9,559,657 | B2 | 1/2017 | Jaisimha et al. | |
| 9,584,347 | B2 | 2/2017 | Elenes | |
| 9,755,598 | B2 | 9/2017 | Olochwoszcz | |
| 9,947,332 | B2 | 4/2018 | Olochwoszcz et al. | |
| 10,177,729 | B1 | 1/2019 | Pahuja et al. | |
| 2006/0019601 | A1* | 1/2006 | Kroeger | H04H 20/30 455/3.06 |
| 2006/0227814 | A1 | 10/2006 | Iannuzzelli et al. | |
| 2006/0229750 | A1 | 10/2006 | Rozier | |
| 2007/0177743 | A1 | 8/2007 | Mertens | |
| 2007/0291876 | A1 | 12/2007 | Shridhar et al. | |
| 2007/0293167 | A1* | 12/2007 | Shridhar | H04H 40/18 455/130 |
| 2008/0119152 | A1* | 5/2008 | Kim | H03G 3/3052 455/234.1 |
| 2009/0070597 | A1 | 3/2009 | Shah et al. | |
| 2011/0009987 | A1* | 1/2011 | Seefeldt | H03G 9/005 700/94 |
| 2011/0110464 | A1* | 5/2011 | Watanabe | H04B 1/1646 375/316 |
| 2012/0028567 | A1 | 2/2012 | Marko | |
| 2013/0003637 | A1 | 1/2013 | Elenes et al. | |
| 2013/0003894 | A1* | 1/2013 | Elenes | H04H 60/12 375/316 |
| 2013/0003904 | A1* | 1/2013 | Elenes | H04H 40/18 375/350 |
| 2013/0247100 | A1 | 9/2013 | Quan | |
| 2013/0259264 | A1 | 10/2013 | Okuhara | |
| 2013/0343547 | A1* | 12/2013 | Pahuja | H04H 40/36 381/2 |
| 2014/0140537 | A1 | 5/2014 | Soulodre | |
| 2015/0248890 | A1* | 9/2015 | Whitecar | G10L 19/008 704/500 |
| 2016/0241350 | A1 | 8/2016 | Nekhamkin et al. | |
| 2017/0169832 | A1 | 6/2017 | Olochwoszcz et al. | |
| 2017/0179899 | A1 | 6/2017 | Olochwoszcz et al. | |
| 2018/0308499 | A1 | 10/2018 | Olochwoszcz et al. | |

FOREIGN PATENT DOCUMENTS

| | | | |
|---|---|---|---|
| WO | WO-2017100528 | A1 | 6/2017 |
| WO | WO-201961401 | A1 | 8/2019 |

OTHER PUBLICATIONS

"U.S. Appl. No. 14/966,716, Examiner Interview Summary dated Nov. 14, 2017", 3 pgs.
"U.S. Appl. No. 14/966,716, Non Final Office Action dated Sep. 8, 2017", 8 pgs.
"U.S. Appl. No. 14/966,716, Notice of Allowance dated Dec. 13, 2017", 8 pgs.
"U.S. Appl. No. 14/966,716, Response filed Nov. 9, 2017 to Non Final Office Action dated Sep. 8, 2017", 9 pgs.
"U.S. Appl. No. 14/974,809, Non Final Office Action dated Feb. 7, 2017", 10 pgs.
"U.S. Appl. No. 14/974,809, Notice of Allowance dated May 3, 2017", 8 pgs.
"U.S. Appl. No. 14/974,809, Response filed Apr. 19, 2017 Non Final Office Action dated Feb. 7, 2017", 7 pgs.
"U.S. Appl. No. 15/899,135, Corrected Notice of Allowability dated Sep. 25, 2018", 2 pgs.
"U.S. Appl. No. 15/899,135, Notice of Allowance dated Aug. 30, 2018", 9 pgs.
"U.S. Appl. No. 15/926,536, Non Final Office Action dated Aug. 9, 2018", 10 pgs.
"U.S. Appl. No. 15/926,536, Notice of Allowance dated Nov. 28, 2018", 8 pgs.
"U.S. Appl. No. 15/926,536, Response filed Oct. 17, 2018 to Non Final Office Action dated Aug. 9, 2018", 12 pgs.
"In-Band/On-Channel Digital Radio Broadcasting Standard", NRSC-5-C, National Radio Systems Committee, Washington, DC,, (Sep. 2011), 6 pgs.
"International Application Serial No. PCT/US2016/065754, International Preliminary Report on Patentability dated Jun. 21, 2018", 10 pgs.
"International Application Serial No. PCT/US2016/065754, International Search Report dated Mar. 10, 2017", 4 pgs.
"International Application Serial No. PCT/US2016/065754, Written Opinion dated Mar. 10, 2017", 10 pgs.
"International Application Serial No. PCT/US2019/018610, International Search Report dated Mar. 2, 2019", 2 pgs.
"International Application Serial No. PCT/US2019/018610, Written Opinion dated Mar. 2, 2019", 3 pgs.
Soulodre, Gilbert A, et al., "Development and Evaluation of Short-Term Loudness Meters", Audio Engineering Society Convention Paper 6889, Presented at the 121st Convention, San Francisco, California, (Oct. 5-8, 2006), 1-10.
Soulodre, Gilbert A, "Evaluation of Objective Loudness Meters", Audio Engineering Society Convention Paper 6161, Presented at the 116th Convention, Berlin, Germany,, (May 8-11, 2004), 1-12.
"International Application Serial No. PCT/US2019/018610, International Preliminary Report on Patentability dated Sep. 3, 2020", 5 pgs.
"Canadian Application Serial No. 3008923, Office Action dated Jan. 12, 2022", 5 pgs.
"International Application Serial No. PCT US2016 067118, International Preliminary Report on Patentability dated Jun. 19, 2018", 9 pgs.

(56) References Cited

OTHER PUBLICATIONS

"Algorithms to Measure Audio Programme Loudness and True-Peak Audio Level", Recommendation ITU-R BS. 1770-3, Electronic Publication, Geneva, Aug. 2012.

* cited by examiner

METHOD AND APPARATUS FOR LEVEL CONTROL IN BLENDING AN AUDIO SIGNAL IN AN IN-BAND ON-CHANNEL RADIO SYSTEM

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

FIELD OF THE INVENTION

The described methods and apparatus relate to digital radio broadcast receivers and, in particular, to methods and apparatus for level alignment of analog and digital pathways in digital radio receivers.

BACKGROUND OF THE INVENTION

Digital radio broadcasting technology delivers digital audio and data services to mobile, portable, and fixed receivers. One type of digital radio broadcasting, referred to as in-band on-channel (IBOC) digital audio broadcasting (DAB), uses terrestrial transmitters in the existing Medium Frequency (MF) and Very High Frequency (VHF) radio bands. HD Radio™ technology, developed by iBiquity Digital Corporation, is one example of an IBOC implementation for digital radio broadcasting and reception.

IBOC technology can provide digital quality audio, superior to existing analog broadcasting formats. Because each IBOC signal is transmitted within the spectral mask of an existing AM or FM channel allocation, it requires no new spectral allocations. IBOC promotes economy of spectrum while enabling broadcasters to supply digital quality audio to the present base of listeners.

The National Radio Systems Committee, a standard-setting organization sponsored by the National Association of Broadcasters and the Consumer Electronics Association, adopted an IBOC standard, designated NRSC-5, in September 2005. NRSC-5, the disclosure of which is incorporated herein by reference, sets forth the requirements for broadcasting digital audio and ancillary data over AM and FM broadcast channels. The standard and its reference documents contain detailed explanations of the RF/transmission subsystem and the transport and service multiplex subsystems. Copies of the standard can be obtained from the NRSC at http://www.nrscstandards.org/standards.asp. iBiquity's HD Radio technology is an implementation of the NRSC-5 IBOC standard. Further information regarding HD Radio technology can be found at www.hdradio.com and www.ibiquity.com.

IBOC signals can be transmitted in a hybrid format including an analog modulated carrier in combination with a plurality of digitally modulated carriers or in an all-digital format wherein the analog modulated carrier is not used. Using the hybrid mode, broadcasters may continue to transmit analog AM and FM simultaneously with higher-quality and more robust digital signals, allowing themselves and their listeners to convert from analog-to-digital radio while maintaining their current frequency allocations.

Both AM and FM In-Band On-Channel (IBOC) hybrid broadcasting systems utilize a composite signal including an analog modulated carrier and a plurality of digitally modulated subcarriers. Program content (e.g., audio) can be redundantly transmitted on the analog modulated carrier and the digitally modulated subcarriers. The analog audio is delayed at the transmitter by a diversity delay.

In the absence of the digital audio signal (for example, when the channel is initially tuned) the analog AM or FM backup audio signal is fed to the audio output. When the digital audio signal becomes available, a blend function smoothly attenuates and eventually replaces the analog backup signal with the digital audio signal while blending in the digital audio signal such that the transition preserves some continuity of the audio program. Similar blending occurs during channel outages which corrupt the digital signal. In this case the analog signal is gradually blended into the output audio signal by attenuating the digital signal such that the audio is fully blended to analog when the digital corruption appears at the audio output. Corruption of the digital audio signal can be detected during the diversity delay time through cyclic redundancy check (CRC) error detection means, or other digital detection means in the audio decoder or receiver.

The concept of blending between the digital audio signal of an IBOC system and the analog audio signal has been previously described in, for example, U.S. Pat. Nos. 7,546,088; 6,178,317; 6,590,944; 6,735,257; 6,901,242; and 8,180,470, the disclosures of which are hereby incorporated by reference. The diversity delay and blend allow the receiver to fill in the digital audio gaps with analog audio when digital outages occur. The diversity delay ensures that the audio output has a reasonable quality when brief outages occur in a mobile environment (for example, when a mobile receiver passes under a bridge). This is because the time diversity causes the outages to affect different segments of the audio program for the digital and analog signals.

In the receiver, the analog and digital pathways may be separately, and thus asynchronously, processed. In a software implementation, for example, analog and digital demodulation processes may be treated as separate tasks using different software threads. Subsequent blending of the analog and digital signals requires that the signals be aligned in time before they are blended.

Both FM and AM Hybrid In-Band On-Channel (IBOC) HD Radio™ receivers require an audio blend function for the purposes of blending to the FM or AM analog backup signal when the digital signal is unavailable. The maximum blend transition time is limited by the diversity delay and receiver decoding times, and is typically less than one second. Frequent blends can sometimes degrade the listening experience when the audio differences between the digital and analog are significant.

Blending will typically occur at the edge of digital coverage and at other locations within the coverage contour where the digital waveform is corrupted. When a short outage does occur, such as traveling under a bridge, the loss of digital audio is replaced by an analog signal. When blending occurs, it is important that the content on the analog audio and digital audio channels are aligned in both time and level (i.e., loudness) to ensure that the transition is barely noticed by the listener. Optimally, the listener will notice little other than possible inherent quality differences in analog and digital audio at these blend points. However, if the broadcast station does not have the analog and digital audio signals aligned, then the result could be a harsh sounding transition between digital and analog audio. The misalignment may occur because of audio processing differences between the analog audio and digital audio paths at the broadcast facility. Furthermore the analog and digital signals are typically generated with two separate signal generation paths before combining for output. The use of different analog processing techniques and different signal generation methods makes the alignment of these two signals nontrivial. The blending should be smooth and continuous, which can happen only if the analog and digital audio are aligned in both time and level.

It would be desirable to process a digital radio signal in a manner that allows blending of the digital and analog components without an abrupt change in loudness of the audio output.

SUMMARY

In one embodiment, a method for processing a digital audio broadcast signal includes: (a) separating an analog audio portion of the digital audio broadcast signal from a digital audio portion of the digital audio broadcast signal; (b) determining a loudness of the analog audio portion over a first short time interval; (c) determining a loudness of the digital audio portion over the first short time interval; (d) using the loudness of the analog audio portion and the loudness of the digital audio portion to calculate a short term average gain; (e) determining a long term average gain; (f) converting one of the long term average gain or the short term average gain to dB; (g) if an output has been blended to digital, adjusting a digital gain parameter by a preselected increment to produce an adjusted digital gain parameter; (h) if an output has not been blended to digital, setting the digital gain parameter to the short term average gain; (i) providing the digital gain parameter to an audio processor; and (j) repeating steps (a) through (i) using a second short time interval.

In another embodiment, a radio receiver includes: processing circuitry configured to: (a) separate an analog audio portion of the digital audio broadcast signal from a digital audio portion of the digital audio broadcast signal; (b) determine a loudness of the analog audio portion over a first short time interval; (c) determine a loudness of the digital audio portion over the first short time interval; (d) use the loudness of the analog audio portion and the loudness of the digital audio portion to calculate a short term average gain; (e) determine a long term average gain; (f) convert one of the long term average gain or the short term average gain to dB; (g) if an output has been blended to digital, adjust a digital gain parameter by a preselected increment to produce an adjusted digital gain parameter; (h) if an output has not been blended to digital, set the digital gain parameter to the short term average gain; (i) provide the digital gain parameter to an audio processor; and (j) repeat steps (a) through (i) using a second short time interval.

DETAILED DESCRIPTION OF THE INVENTION

Embodiments described herein relate to the processing of the digital and analog components of a digital radio broadcast signal. While aspects of the disclosure are presented in the context of an exemplary IBOC system, it should he understood that the present disclosure is not limited to IBOC systems and that the teachings herein are applicable to other forms of digital radio broadcasting as well.

Figure 1:
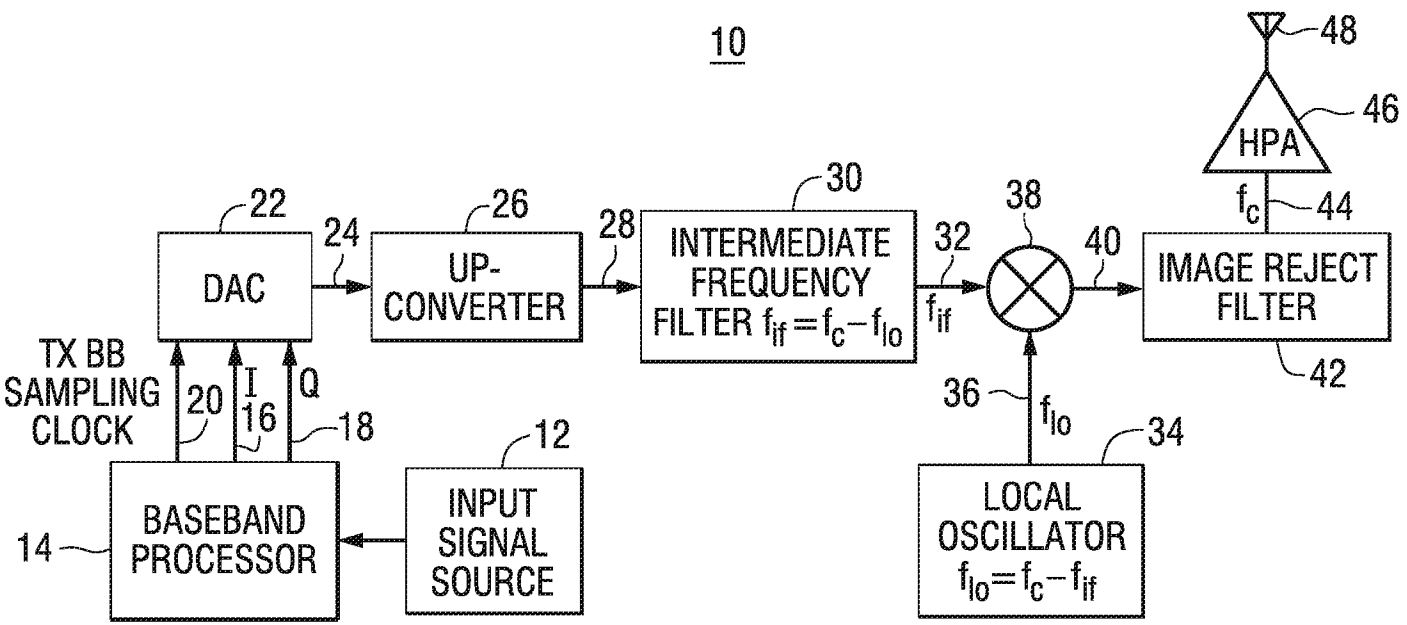
FIG. 1 is a functional block diagram of an exemplary digital radio broadcast transmitter.

Referring to the drawings, FIG. 1 is a block diagram of an exemplary digital radio broadcast transmitter 10 that broadcasts digital audio broadcasting signals. The exemplary digital radio broadcast transmitter may be a DAB transmitter such as an AM or FM IBOC transmitter, for example. An input signal source 12 provides the signal to be transmitted. The source signal may take many forms, for example, an analog program signal that may represent voice or music and/or a digital information signal that may represent message data such as traffic information. A baseband processor 14 processes the source signal in accordance with various known signal processing techniques, such as source coding, interleaving and forward error correction, to produce in-phase and quadrature components of a complex baseband signal on lines 16 and 18, and to produce a transmitter baseband sampling clock signal 20. Digital-to-analog converter (DAC) 22 converts the baseband signals to an analog signal using the transmitter baseband sampling clock 20, and outputs the analog signal on line 24. The analog signal is shifted up in frequency and filtered by the up-converter block 26. This produces an analog signal at an intermediate frequency $f_{if}$ on line 28. An intermediate frequency filter 30 rejects alias frequencies to produce the intermediate frequency signal $f_{if}$ on line 32. A local oscillator 34 produces a signal $f_{lo}$ on line 36, which is mixed with the intermediate frequency signal on line 32 by mixer 38 to produce sum and difference signals on line 40. The unwanted intermodulation components and noise are rejected by image reject filter 42 to produce the modulated carrier signal $f_c$ on line 44. A high power amplifier (HPA) 46 then sends this signal to an antenna 48.

In one example, a basic unit of transmission of the DAB signal is the modem frame, which is typically on the order of a second in duration. Exemplary AM and FM IBOC DAB transmission systems arrange the digital audio and data in units of modem frames. Some transmission systems are both simplified and enhanced by assigning a fixed number of audio frames to each modem frame. The audio frame period is the length of time required to render, e.g., play back audio for a user, the samples in an audio frame. For example, if an audio frame contains 1024 samples, and the sampling period is 22.67 μsec, then the audio frame period would be approximately 23.2 milliseconds. A scheduler determines the total number of bits allocated to the audio frames within each modem frame. The modem frame duration is advantageous because it may enable sufficiently long interleaving times to mitigate the effects of fading and short outages or noise bursts such as may be expected in a digital audio broadcasting system. Therefore the main digital audio signal can be processed in units of modem frames, and audio processing, error mitigation, and encoding strategies may be able to exploit this relatively large modem frame time without additional penalty.

In typical implementations, an audio encoder may be used to compress the audio samples into audio frames in a manner that is more efficient and robust for transmission and reception of the IBOC signal over the radio channel. The audio encoder encodes the audio frames using the bit allocation for each modem frame. The remaining bits in the modem frame are typically consumed by the multiplexed data and overhead. Any suitable audio encoder can initially produce the compressed audio frames such as an HDC encoder as developed by Coding Technologies of Dolby Laboratories, Inc.; an Advanced Audio Coding (AAC) encoder; an MPEG-1 Audio Layer 3 (MP3) encoder; or a Windows Media Audio (WMA) encoder. Typical lossy audio encoding schemes, such as AAC, MP3, and WMA, utilize the modified discrete cosine transform (MDCT) for compressing audio data. MDCT based schemes typically compress audio samples in blocks of a fixed size. For example, in AAC encoding, the encoder may use a single MDCT block of length 1024 samples or 8 blocks of 128 samples. Accordingly, in implementations using an AAC coder, for example, each audio frame could be comprised of a single block of 1024 audio samples, and each modem frame could include 64 audio frames. In other typical implementations, each audio frame could be comprised of a single block of 2048 audio samples, and each modem frame could include 32 audio frames. Any other suitable combination of sample block sizes and audio frames per modem frame could be utilized.

In an exemplary IBOC DAB system, the broadcast signal includes main program service (MPS) audio, MPS data (MPSD), supplemental program service (SPS) audio, and SPS data (SPSD). MPS audio serves as the main audio programming source. In hybrid modes, it preserves the existing analog radio programming formats in both the analog and digital transmissions. MPSD, also known as program service data (PSD), includes information such as music title, artist, album name, etc. Supplemental program service can include supplementary audio content as well as PSD. Station Information Service (SIS) is also provided, which comprises station information such as call sign, absolute time, position correlated to GPS, data describing the services available on the station. In certain embodiments, Advanced Applications Services (AAS) may be provided that include the ability to deliver many data services or streams and application specific content over one channel in the AM or FM spectrum, and enable stations to broadcast multiple streams on supplemental or sub-channels of the main frequency.

Figure 2:
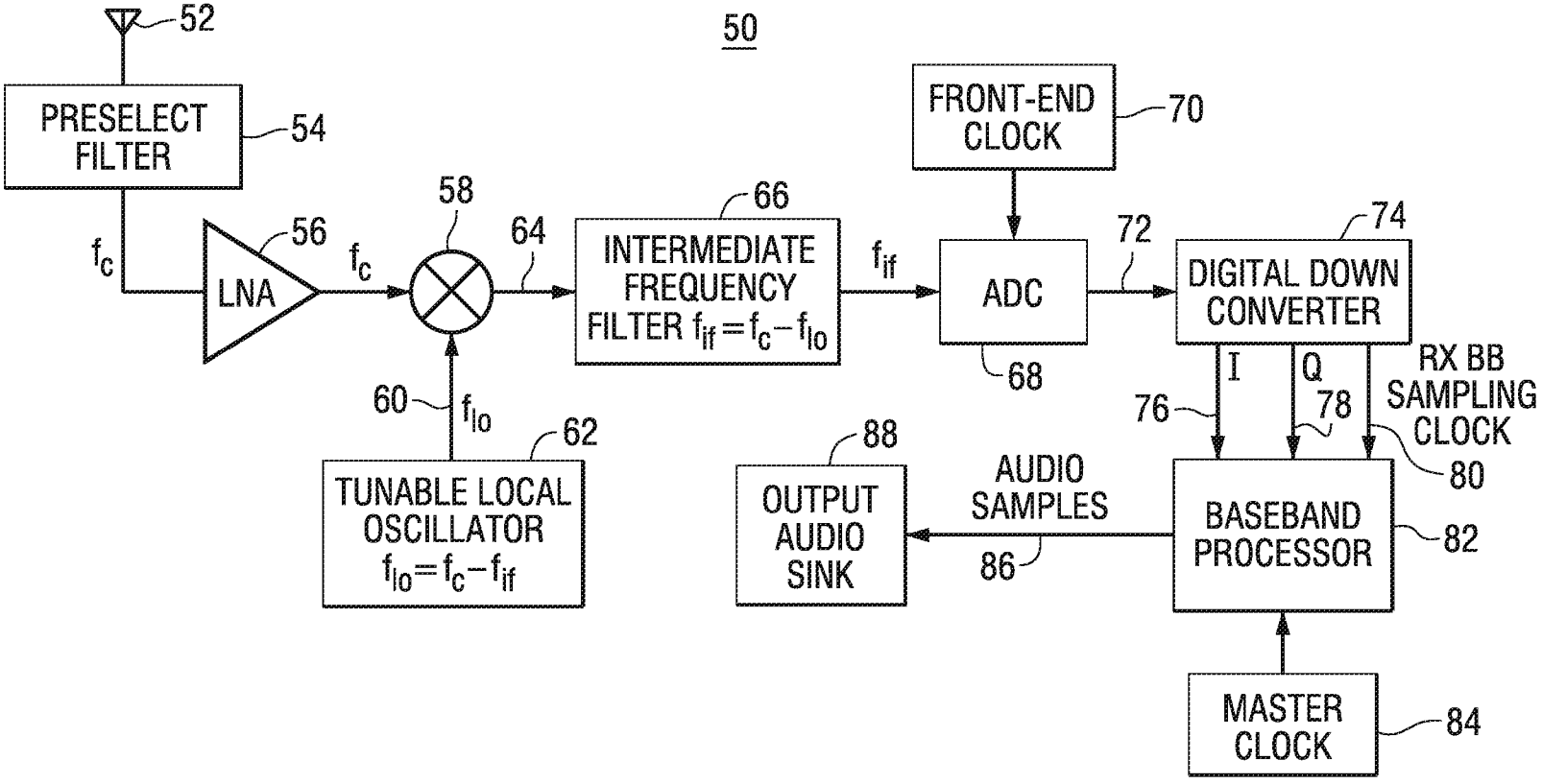
FIG. 2 is a functional block diagram of an exemplary digital radio broadcast receiver.

A digital radio broadcast receiver performs the inverse of some of the functions described for the transmitter. FIG. 2 is a block diagram of an exemplary digital radio broadcast receiver 50. The exemplary digital radio broadcast receiver 50 may be a DAB receiver such as an AM or FM IBOC receiver, for example. The DAB signal is received on antenna 52. A bandpass preselect filter 54 passes the frequency band of interest, including the desired signal at frequency $f_c$, but rejects the image signal at $f_c$-$2f_{if}$ (for a low side lobe injection local oscillator). Low noise amplifier (LNA) 56 amplifies the signal. The amplified signal is mixed in mixer 58 with a local oscillator signal $f_{lo}$ supplied on line 60 by a tunable local oscillator 62. This creates sum ($f_c$+$f_{lo}$) and difference ($f_c$−$f_{lo}$) signals on line 64. Intermediate frequency filter 66 passes the intermediate frequency signal $f_{if}$ and attenuates frequencies outside of the bandwidth of the modulated signal of interest. An analog-to-digital converter (ADC) 68 operates using the front-end clock 70 to produce digital samples on line 72. Digital down converter 74 frequency shifts, filters and decimates the signal to produce lower sample rate in-phase and quadrature signals on lines 76 and 78. The digital down converter 74 also outputs a receiver baseband sampling clock signal 80. A baseband processor 82, operating using the master clock 84 that may or may not be generated from the same oscillator as the front-end clock 70, then provides additional signal processing. The baseband processor 82 produces output audio samples on line 86 for output to audio sink 88. The output audio sink may be any suitable device for rendering audio such as an audio-video receiver or car stereo system.

Figure 3:
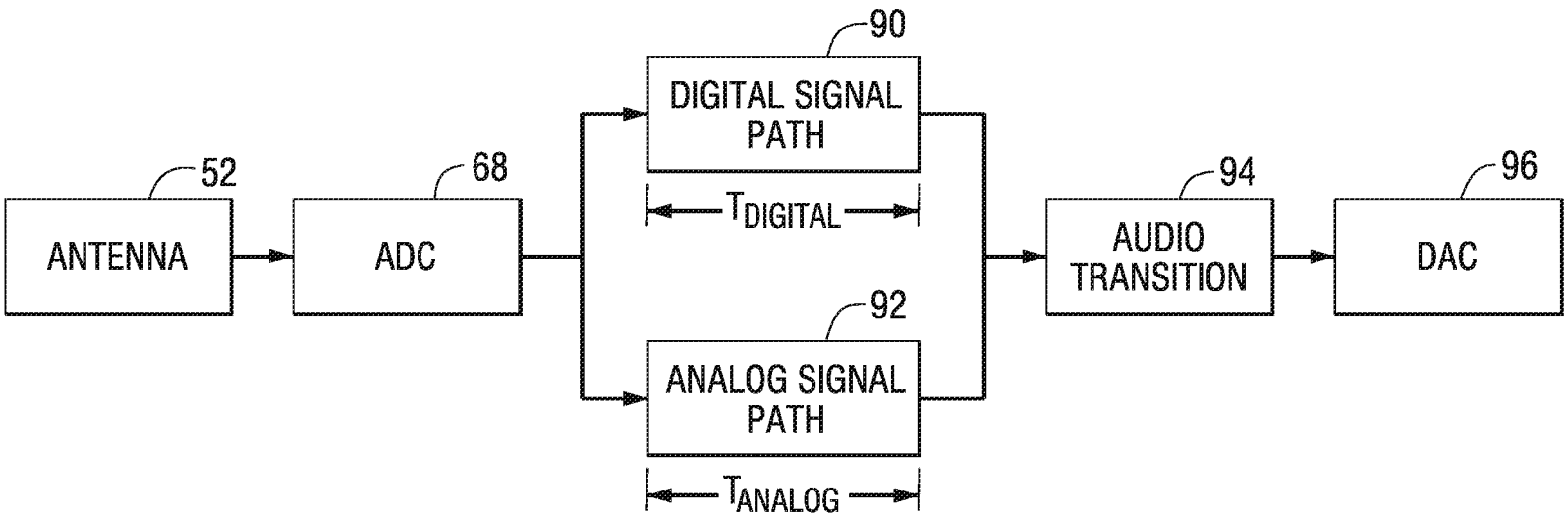
FIG. 3 is a functional block diagram that shows separate digital and analog signal paths in a receiver.

FIG. 3 is a functional block diagram that shows separate digital and analog signal paths in a receiver. A hybrid radio broadcast signal is received on antenna 52, and is converted to a digital signal in ADC 68. The hybrid signal is then split into a digital signal path 90 and an analog signal path 92. In the digital signal path 90, the digital signal is acquired, demodulated, and decoded into digital audio samples as described in more detail below. The digital signal spends an amount of time $T_{DIGITAL}$ in the digital signal path 90, which is a variable amount of time that will depend on the acquisition time of the digital signal and the demodulation and decoding times of the digital signal path. The acquisition time can vary depending on the strength of the digital signal due to radio propagation interference such as fading and multipath.

In contrast, the analog signal (i.e., the digitized analog audio samples) spends an amount of time $T_{ANALOG}$ in the analog signal path 92. $T_{ANALOG}$ is typically a constant amount of time that is implementation dependent. It should be noted that the analog signal path 92 may be co-located with the digital signal path on the baseband processor 82 or separately located on an independent analog processing chip. Since the time spent traveling through the digital signal path $T_{DIGITAL}$ and the analog signal path $T_{ANALOG}$ may be different, it is desirable to align the samples from the digital signal with the samples from the analog signal within a predetermined amount so that they can be smoothly combined in the audio transition module 94. The alignment accuracy will preferably be chosen to minimize the introduction of audio distortions when blending from analog to digital and visa versa. The digital and analog signals are combined and travel through the audio transition module 94. Then the combined digitized audio signal is converted into analog for rendering via the digital-to-analog converter (DAC) 96. As used in this description, references to "analog" or "digital" with regard to a particular data sample streams in this disclosure connote the radio signal from which the sample stream was extracted, as both data streams are in a digital format for the processing described herein.

One technique for determining time alignment between signals in digital and analog pathways performs a correlation between the samples of the two audio streams and looks for the peak of the correlation. Time samples of digital and analog audio are compared as one sample stream is shifted in time against the other. The alignment error can be calculated by successively applying offsets to the sample streams until the correlation peaks. The time offset between the two samples at peak correlation is the alignment error. Once the alignment error has been determined, the timing of the digital and/or analog audio samples can be adjusted to allow smooth blending of the digital and analog audio.

While the description of the previously existing blend technique illustrated in FIG. 3 uses a 1024 sample audio frame used in a particular audio compression codec, it should be recognized that the technique could be applied to 2048 sample audio frames used in other codecs.

Figure 4:
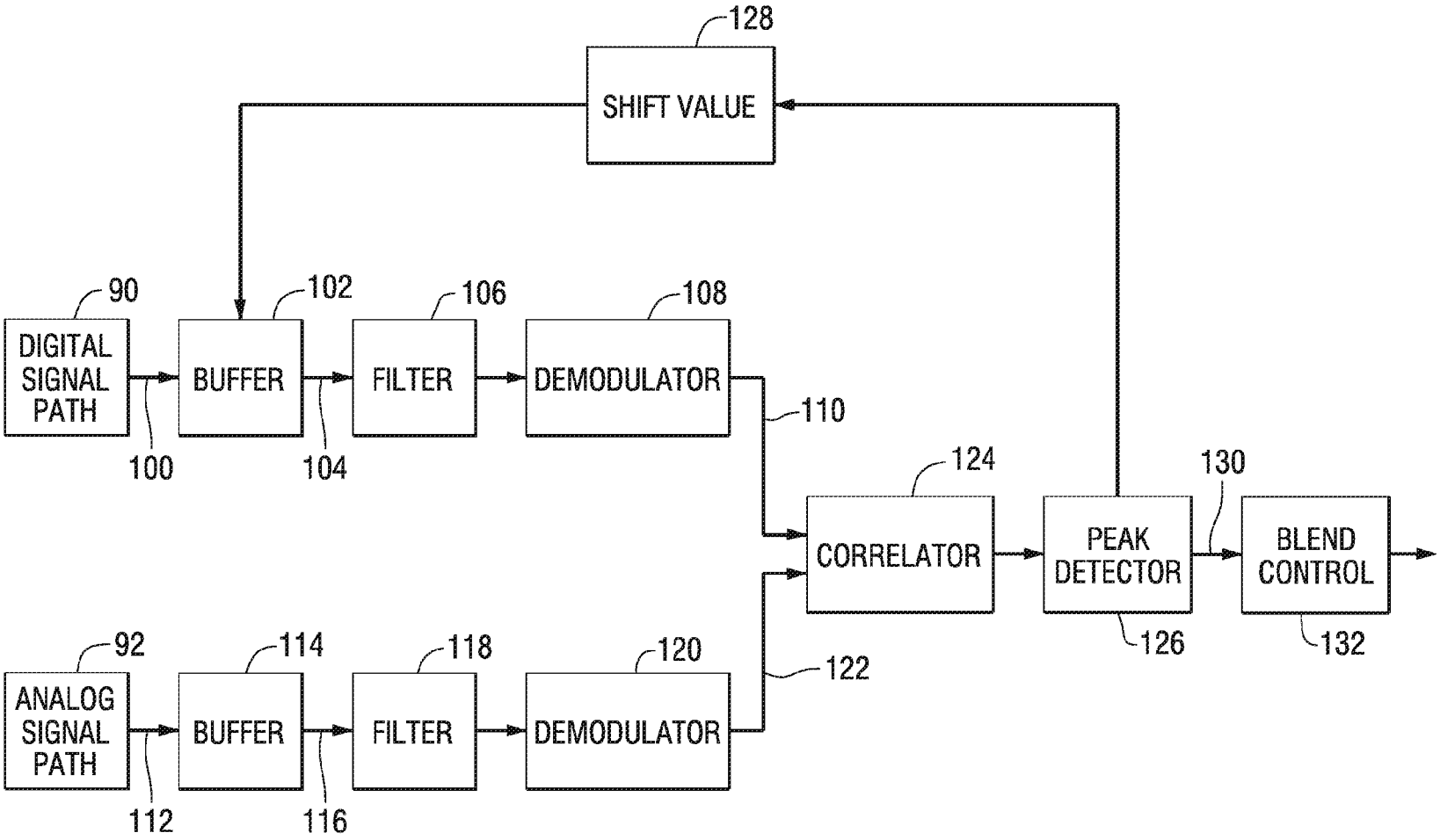
FIG. 4 is a functional block diagram that shows elements of a time alignment module.

FIG. 4 is a functional block diagram of an apparatus for determining timing offset between analog and digital audio streams within a desired accuracy using downsampled audio streams. The system of FIG. 4 is more fully described in commonly owned U.S. patent application Ser. No. 14/862,800, filed Sep. 23, 2015, which is hereby incorporated by reference. In the embodiment of FIG. 4, the digital signal path 90 supplies a first stream of samples representative of the content of the received digitally modulated signal on line 100. The samples from the first sample stream are stored in buffer 102. The first stream of samples on line 104 is filtered by an anti-aliasing filter 106 and downsampled (decimated) as shown in block 108 to produce a first decimated sample stream on line 110. The analog signal path 92 supplies a second stream of samples representative of the content of the received analog modulated signal on line 112. Samples from the second stream of samples are stored in buffer 114. The second stream of samples on line 116 is filtered by an anti-aliasing filter 118 and downsampled (decimated) as shown in block 120 to produce a second decimated sample stream on line 122. A correlator 124 performs a cross-correlation on samples of the first and second decimated sample streams and a peak detector 126 determines an offset between samples of the decimated streams that are most highly correlated. Due to the decimation of the input signals, the peak detector output actually represents a range of possible stream offsets. This offset range is then used to determine a shift value for one of the first and second sample streams, as illustrated in block 128. Then the shifted sample stream is decimated and correlated with the decimated samples from the unshifted stream. By running the estimation multiple times with a shifted input, the range of valid results is now limited to the intersection of the range of valid results of the first estimation and the range of valid results of the second estimation. The steps of shifting, decimating, correlating and peak detection can be repeated until a desired accuracy of the time alignment of the first and second sample streams is achieved. At that point, a control signal is output on line 130. Then the blend control 132 can use the control signal to blend the analog and digital signal paths.

The correlation operation performed by the correlator may include multiplying together decimated data from each stream. The result of the multiplication may appear as noise, with a large peak when the data streams are aligned in time.

In the system of FIG. 4, the peak detector may analyze correlation results over time to search for peaks that indicate that the digital data streams are aligned in time. In some embodiments, a squaring function may square the product output by the correlator in order to further emphasize the peaks. Based on the received data, the peak search unit may output an indication of the relative delay between the analog data stream and the digital data stream. The indication of relative delay may include an indication of which one of the two data streams is leading the other.

Once the analog and digital data streams are sufficiently aligned, a blend operation may begin. The blend operation may be conducted, for example, by reducing the contribution of the analog data stream to the output audio while correspondingly increasing the contribution of the digital data stream until the latter is the exclusive source.

The transition time between the analog and digital audio outputs is generally less than one second, which is limited by the diversity delay and receiver decoding times. The relatively short blend transition time presents challenges in designing blending systems. It has been observed that frequent transitions between the analog and digital audio can be somewhat annoying when the difference in audio quality and loudness between the digital audio and the analog audio is significant. This is especially significant when the digital signal has a wider audio bandwidth than the analog audio, and the digital signal is stereo while the analog is mono. This phenomenon can occur in mobile receivers in fringe coverage areas when highway overpasses (or power lines for AM) are frequently encountered.

International Telecommunication Union Recommendation ITU-R BS.1770-3 specification, hereinafter referred to as ITU 1770, is a primary standard for loudness measurement. ITU 1770 algorithms can be used to measure audio program loudness and true-peak audio level. In ITU 1770, the Equivalent Sound Level, $L_{eq}$, is simply defined as the RMS sound power of the signal relative to a reference sound power. This calculation is easily accomplished with minimal memory and MIPS (millions of instructions per second). An optional frequency weighting prior to the sound power calculation is specified as an "RLB" filter, which is a simple low pass at ~100 Hz followed by a filter that applies a 4 dB boost to frequencies above approximately 2 kHz. Adding the filter calculations for an RLB weighting filter does not require significantly more MIPS/Memory.

The loudness difference between analog and digital audio can change dynamically. For example, up to 10 dB in loudness difference has been measured when comparing analog and digital audio at various points in the same program. If the loudness difference is small when blending to digital and later in the program the difference becomes greater, possibly 10 dB greater, a blend back to analog would result in an unacceptable abrupt change in loudness. This is primarily due to the dynamic nature of the loudness difference between digital and analog audio within a single program. This loudness difference exists for numerous reasons including, but not limited to, different processing applied to the analog and digital audio, poor signal conditions, etc.

A short term loudness match at the time a blend operation is performed, coupled with a long term loudness equalization of the digital audio can solve this fundamental problem.

There are conflicting requirements when setting analog and digital loudness in the HD Radio system. The first requirement, referred to as a "long term loudness difference", requires that the loudness perceived over the duration of the program must be consistent whether listening to the analog stream or the digital stream. The second requirement, referred to as a "short term loudness difference", occurs at the transition time between the two streams. This transition time is generally short (e.g., <1 second), and the loudness must be relatively equal (e.g., ±2 dB), or else the listener will perceive the difference. Measurements have found that the short and long term loudness values can be drastically different as the content of the program changes. Therefore, at the point of blend a short term value is used so that the transition time sounds smooth. The short term loudness can be determined over a short time interval. The short time interval is a time in the range of 1 to 5 seconds. In one embodiment, the short time interval is 2.97 seconds. The ideal short time interval for a particular application can be determined based on audio perception and perceptual memory, such as what is perceived by human hearing to be instantaneous.

The short term loudness value can be slowly ramped to the long term value as the program continues so that the overall perceived loudness of a given program is the same regardless of whether the analog or digital audio stream is playing. The long term loudness can be determined over a long time interval. The long term loudness can be determined over a long time interval. The long time interval is a time in the range of 5 to 30 seconds. In one embodiment, the long time interval is in a range of 5.94 to 29.72 seconds. The long time interval is always longer than the short time interval.

Generally, the short time interval must be several seconds, and always less than the long time interval. In some embodiments, the long time interval is measured in integer multiples of the short time interval. This is not a strict requirement for the process, but was chosen to simplify implementation.

When the level of the digital audio stream matches the level of the analog audio stream, the streams can be blended to produce an audio output signal. The short term loudness measurement is calculated and used to update a long term running average loudness value. The minimum time before blend may occur when level control is enabled is the short time interval.

Figure 5:
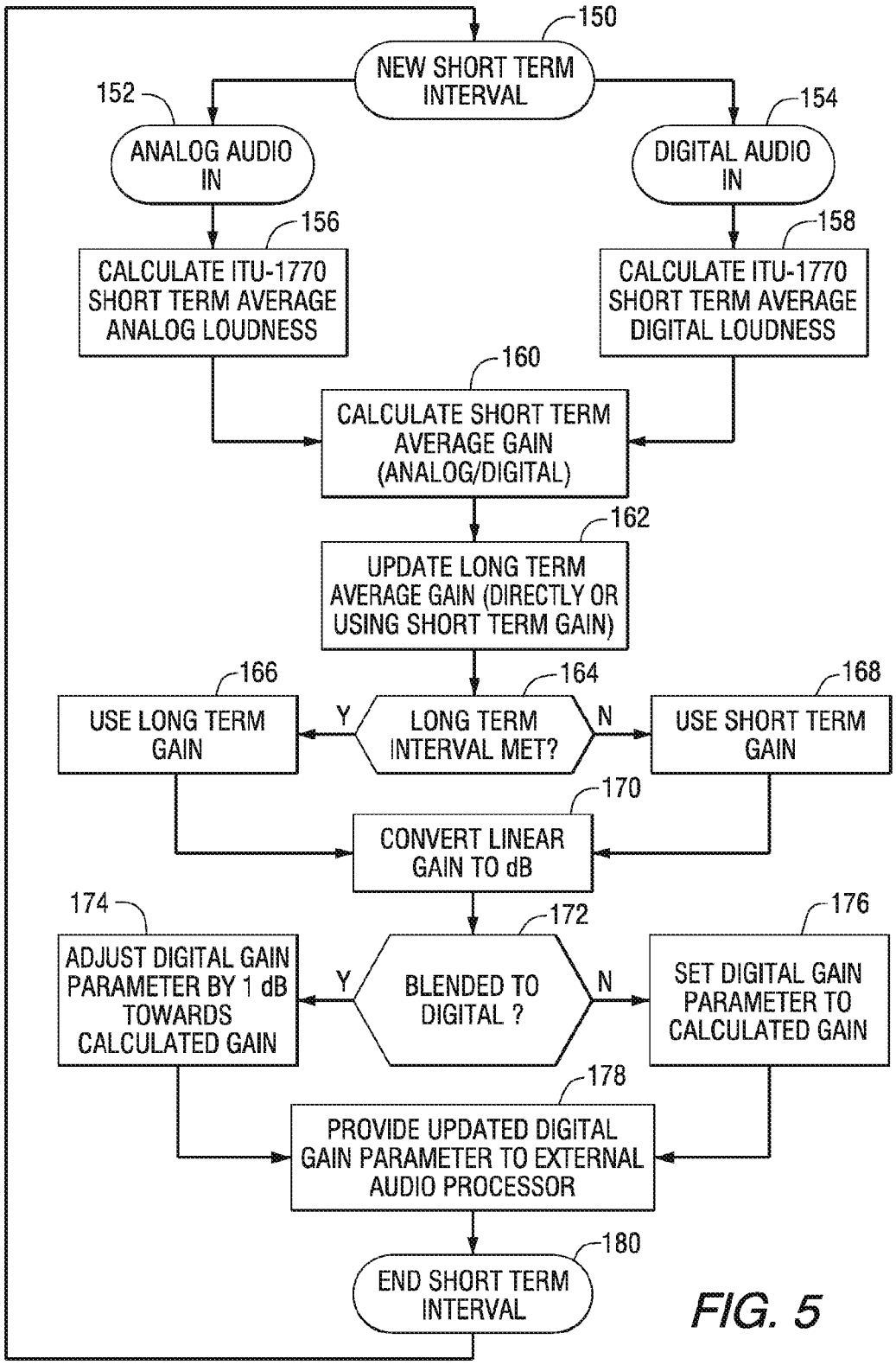
FIG. 5 is a flow block diagram of a method for level alignment in accordance with an embodiment of the invention.

FIG. 5 is a flow block diagram of a method for level alignment in accordance with an embodiment of the invention. The process starts by receiving audio samples over a short time interval as shown in block 150. The analog and digital signal streams are separated as shown in blocks 152 and 154. This separation may be accomplished using the elements of FIG. 3. The analog and digital audio signals may be filtered using a perceptual filter to improve the results.

A short term average power (loudness) is calculated for each stream as shown in blocks 156 and 158. This calculation can be performed using the algorithm set forth in ITU-1770. Then a short term average gain is calculated as shown in block 160. The short term average gain is calculated as the linear ratio of analog audio power to digital audio power. Block 162 shows that the long term average gain is then calculated, either directly or using the short term gain. The short term average gain is the gain determined over the short time interval. The long term average gain is the gain determined over the long time interval.

The next step depends on whether or not the long time interval has been met as shown in block 164. In one implementation, the long time interval is comprised of integer multiples of the short time interval and the long term gain is calculated using a running average of the short term gain. Another implementation could calculate the short term and long term gain independently over different intervals. An audio frame counter can be used to determine when each of the short and long time intervals has been met.

If the long time interval has been met, the long term gain (running average) over the full long time interval is used as shown in block 166. If the long time interval has not been met, the short term gain is used as shown in block 168. The short term gain may be averaged with previously calculated short term gain measurements to generate a partial long term gain, but this is not a strict requirement. In either case, the gain is converted from a linear ratio to integer dB (always rounding down), as shown in block 170, and provided to a host processor for the purpose of adjusting the digital audio loudness during blend to better match the loudness of the analog audio. The range of digital gain correction which can be applied is −8 dB to 7 dB, in 1 dB increments.

The next step depends on whether or not the output of the receiver has already been blended to digital as shown in block 172. If the output of the receiver has already been blended to digital, the digital gain is adjusted by a predetermined amount (e.g., 1 dB) towards the calculated long term gain, as shown in block 174. The adjustment step size should be less than 1.5 dB to avoid immediately perceptible changes in output volume. If the output of the receiver has not been blended to digital, the digital gain is set to the calculated gain, as shown in block 176. The updated digital gain parameter is provided to an external audio processor, as shown in block 178. Then the short time interval is ended as shown in block 180 and a new short time interval is used for subsequent iterations of the process as shown in block 150.

The method illustrated in FIG. 5 periodically provides a gain parameter which can be used by the host to adjust the digital stream loudness so that over the long term digital loudness matches long term analog loudness. Before each blend to digital a short term measurement/adjustment of a minimum interval can be used to guarantee the loudness difference at the blend point is minimal. From that point on a continuous measurement of the analog and digital audio stream levels could be made using a known type of loudness measurement, such as the technique defined in the ITU-1770. The loudness measurements are always performed on the original digital audio stream provided from the decoder. The digital audio gain is a parameter which is sent to the external audio processor on the host. The host is responsible for applying the loudness adjustment to the output audio. This system does not directly modify the analog or digital audio in any way.

Updating the gain of the digital audio signal with this long term loudness difference value could drive the long term average loudness of the digital to match that of the analog. If the step size were kept small, for example 1 dB, and the update rate were sufficiently long, for example 3, 5 or 10 seconds, then the difference in audio level could be imperceptible to a listener. After a time the loudness measurements would stabilize and digital volume would reliably track the analog volume. This would minimize the potential volume difference at the next blend to analog without causing major changes in the digital volume during playback.

In one embodiment, the short term level measurement can be performed on samples that occur after time alignment resulting in a longer delay to blend. However, the time alignment algorithm can be run multiple times to ensure consistency. Then the short term level alignment function can be run concurrently with a second (or subsequent) execution of the time alignment algorithm, using the alignment value from the first execution. In addition, because the short term level alignment can be executed separately from time alignment, the level alignment algorithm could be run continuously (for example over a 3 second sample window) regardless of the time alignment range.

The functions shown in FIG. 5 can be implemented in the circuitry of a radio receiver, using for example, one or more processors that are programmed or otherwise configured to perform the functions described herein. Other hardware embodiments, as well as software embodiments and combinations thereof may also be used to implement the described method(s).

While the present invention has been described in terms of its preferred embodiments, it will be apparent to those skilled in the art that various modifications can be made to the described embodiments without departing from the scope of the invention as defined by the following claims.

What is claimed is:

1. A method for processing [a digital] *an* audio [broadcast] signal *including multiple audio streams using an audio signal receiver*, the method comprising:

(a) separating [an analog audio portion] *a first audio sample stream* of the [digital] audio [broadcast] signal from a [digital audio portion] *second audio sample stream* of the [digital] audio [broadcast] signal *using the audio signal receiver*;

(b) determining a loudness of the [analog audio portion] *first audio sample stream* over a first short time interval;

(c) determining a loudness of the [digital audio portion] *second audio sample stream* over the first short time interval;

(d) using the loudness of the [analog audio portion] *first audio sample stream* and the loudness of the [digital audio portion] *second audio sample stream* to calculate a short term average gain;

(e) determining a long term average gain;

(f) converting one of the long term average gain or the short term average gain to [dB] *decibels* (*dB*) and providing the converted average gain to an audio processor;

(g) [if an output of a receiver has been blended to digital,] *performing one of blending an output of a receiver to the second audio sample stream and* adjusting a [digital] *second audio sample stream* gain parameter toward the long term average gain by a preselected increment, [to produce an adjusted digital gain parameter; (h) if the output of the receiver has not been blended to digital] *or not blending the output of the receiver to the second audio sample stream and* setting the [digital] *second audio sample stream* gain parameter to the short term average gain;

[(i)] (*h*) providing the [digital] *second audio sample stream* gain parameter [adjusted by] *from* step (g) [or step (h)] to the audio processor; and

[(j)] (*i*) repeating steps (a) through [(i)] (*h*) using a second short time interval.

2. The method of claim 1, wherein:

the short term average gain is a linear ratio of analog audio power *of the first audio sample stream* and digital audio power *of the second audio sample stream*.

3. The method of claim 1, wherein:

the [digital] *second audio sample stream* gain parameter is adjusted toward the short term average gain; and the preselected increment is 1 dB.

4. The method of claim 1, wherein:

the long term average gain comprises a running average of the short term average gain.

5. The method of claim 1, wherein:

the long term average gain is determined independently of the short term average gain.

6. The method of claim 1, wherein:

the long term average gain is converted to dB if a long time interval has been met and the short term average gain is converted to dB if the long time interval has not been met.

7. The method of claim 6, wherein the long time interval comprises an integer multiple of the short time intervals.

8. The method of claim 6, wherein:

the short time interval is in a range from 1 to 5 seconds and the long time interval is in a range from 5 to 30 seconds.

9. The method of claim 1, wherein:

the [analog audio portion] *first audio sample stream* comprises a stream of samples analog modulated program material; and the [digital audio portion] *second audio sample stream* comprises a stream of samples digitally modulated program material.

10. The method of claim 1, wherein the measurements of the levels of the [analog audio portion] *first audio sample stream* and the [digital audio portion] *second audio sample stream* are performed in accordance with the International Telecommunications Union Recommendation (ITU-R) BS.1770 specification.

11. [A radio] *An audio signal* receiver comprising:

processing circuitry configured to:

(a) separate [an analog] *a first* audio [portion] *sample stream* of [the digital] *an* audio [broadcast] signal from a [digital] *second* audio [portion] *sample stream* of the [digital] audio [broadcast] signal;

(b) determine a loudness of the [analog] *first* audio [portion] *sample stream* over a first short time interval;

(c) determine a loudness of the [digital] *second* audio [portion] *sample stream* over the first short time interval;

(d) use the loudness of the [analog] *first* audio [portion] *sample stream* and the loudness of the [digital] *second* audio [portion] *sample stream* to calculate a short term average gain;

(e) determine a long term average gain;

(f) convert one of the long term average gain or the short term average gain to [dB] *decibels* (*dB*) and provide the converted average gain to an audio processor;

(g) [if an output of a receiver has been blended to digital,] *perform one of blend an output of a receiver to the second audio sample stream and* adjust a [digital] *second audio sample stream* gain parameter by a preselected increment [to produce an adjusted digital gain parameter; (h) if the output of the receiver has not been blended to digital], *or not blend the output of the receiver to the second audio sample stream and* set the [digital] *second audio sample stream* gain parameter to the short term average gain;

[(i)] (*h*) provide the [digital] *second audio sample stream* gain parameter [adjusted by] *from* step (g) [or step (h)] to the audio processor; and

[(j)] (*i*) repeat steps (a) through [(i)] (*h*) using a second short time interval.

12. The [radio] *audio signal* receiver of claim 11, wherein:

the short term average gain is a linear ratio of analog audio power and digital audio power.

13. The [radio] *audio signal* receiver of claim 11, wherein:

the [digital] *second audio sample stream* gain parameter is adjusted toward the short term average gain; and the preselected increment is 1 dB.

14. The [radio] *audio signal* receiver of claim 11, wherein:

the long term average gain comprises a running average of the short term average gain.

15. The [radio] *audio signal* receiver of claim 11, wherein:

the long term average gain is determined independently of the short term average gain.

16. The [radio] *audio signal* receiver of claim 11, wherein:

the long term average gain is converted to dB if a long time interval has been met and the short term average gain is converted to dB if the long time interval has not been met.

17. The [radio] *audio signal* receiver of claim 16, wherein the long time interval comprises an integer multiple of the short time intervals.

18. The [radio] *audio signal* receiver of claim 16, wherein:

the short time interval is in a range from 1 to 5 seconds and the long time interval is in a range from 5 to 30 seconds.

19. The [radio] *audio signal* receiver of claim 11, wherein:

the [analog] *first* audio [portion] *sample stream* comprises a stream of samples analog modulated program material; and the [digital] *second* audio [portion] *sample stream* comprises a stream of samples digitally modulated program material.

20. The [radio] *audio signal* receiver of claim 11, wherein the measurements of the levels of the [analog] *first* audio [portion] *sample stream* and the [digital] *second* audio [portion] *sample stream* are performed in accordance with the International Telecommunications Union Recommendation (ITU-R) BS.1770 specification.

* * * * *